(12) United States Patent
Keil et al.

(10) Patent No.: US 7,829,468 B2
(45) Date of Patent: Nov. 9, 2010

(54) METHOD AND APPARATUS TO DETECT FAULT CONDITIONS OF PLASMA PROCESSING REACTOR

(75) Inventors: Douglas Keil, Fremont, CA (US); Eric Hudson, Berkeley, CA (US); Chris Kimball, Fremont, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 898 days.

(21) Appl. No.: 11/447,946

(22) Filed: Jun. 7, 2006

(65) Prior Publication Data

US 2007/0284246 A1   Dec. 13, 2007

(51) Int. Cl.
*H01L 21/302* (2006.01)
*H01L 21/461* (2006.01)

(52) U.S. Cl. ............................ 438/714; 216/59; 216/67

(58) Field of Classification Search ................ 438/706, 438/710, 714; 216/67, 68, 59
See application file for complete search history.

(56) References Cited

U.S. PATENT DOCUMENTS

| | | | |
|---|---|---|---|
| 3,624,240 A | 11/1971 | Damm et al. | |
| 5,861,752 A | 1/1999 | Klick | |
| 5,936,413 A * | 8/1999 | Booth et al. | 324/678 |
| 6,090,304 A | 7/2000 | Zhu et al. | |
| 6,184,623 B1 | 2/2001 | Sugai et al. | |
| 6,326,794 B1 | 12/2001 | Lundquist et al. | |
| 6,383,554 B1 * | 5/2002 | Chang et al. | 427/10 |
| 6,441,620 B1 | 8/2002 | Scanlan et al. | |
| 6,541,982 B2 * | 4/2003 | Kitagawa et al. | 324/464 |
| 6,646,386 B1 | 11/2003 | Sirkis et al. | |
| 6,653,852 B1 | 11/2003 | Benjamin | |
| 6,701,202 B2 | 3/2004 | Nakano et al. | |
| 6,741,944 B1 | 5/2004 | Verdeyen et al. | |
| 6,744,212 B2 | 6/2004 | Fischer et al. | |
| 6,805,810 B2 | 10/2004 | Smith, Jr. et al. | |
| 6,824,627 B2 | 11/2004 | Dhindsa et al. | |
| 6,902,646 B2 | 6/2005 | Mahoney et al. | |
| 7,413,672 B1 * | 8/2008 | Keil | 216/59 |
| 2002/0055259 A1 | 5/2002 | Balasubramhanya et al. | |
| 2002/0065616 A1 | 5/2002 | Leng | |
| 2003/0136511 A1 | 7/2003 | Balasubramhanya et al. | |

(Continued)

OTHER PUBLICATIONS

Booth, Jean-Paul, "*Diagnostics of etching plasmas*," Pure Appl. Chem., vol. 74, No. 3, (2002), pp. 397-400.

(Continued)

*Primary Examiner*—Roberts Culbert
(74) *Attorney, Agent, or Firm*—Buchanan Ingersoll & Rooney PC

(57) ABSTRACT

A method of fault detection for use in a plasma processing chamber is provided. The method comprises monitoring plasma parameters within a plasma chamber with a single planar ion flux (PIF) probe, analyzing the resulting information, measuring the plasma parameters as a function of time and analyzing the resulting data. The data can be observed, characterized, compared with reference data, digitized, processed, or analyzed to reveal a specific fault. The PIF probe is preferably positioned at a grounded surface within the reactor. Chamber faults that can be detected include a build-up of process by-products in the process chamber, a helium leak, a match re-tuning event, a poor stabilization rate, and a loss of plasma confinement.

15 Claims, 15 Drawing Sheets

U.S. PATENT DOCUMENTS

| | | | |
|---|---|---|---|
| 2004/0127031 A1* | 7/2004 | Klekotka | 438/689 |
| 2004/0254762 A1 | 12/2004 | Hopkins et al. | |
| 2005/0019961 A1 | 1/2005 | Davis et al. | |
| 2005/0151544 A1* | 7/2005 | Mahoney et al. | 324/655 |
| 2005/0222781 A1* | 10/2005 | Yue et al. | 702/30 |
| 2005/0241765 A1 | 11/2005 | Dhindsa et al. | |
| 2007/0215285 A1* | 9/2007 | Kimball et al. | 156/345.48 |

OTHER PUBLICATIONS

Torvén, S. et al., "*Rapid Communication—A high frequency probe for absolute measurements of electric fields in plasmas,*" J. Phys. D: Appl. Phys. 28 (1995), pp. 595-599, IOP Publishing Ltd.

Sobolewski, Mark A. et al., "*Ion energy distributions and sheath voltages in a radio-frequency-biased, inductively coupled, high-density plasma reactor,*" Journal of Applied Physics (Apr. 15, 1999), vol. 85, No. 8, pp. 3966-3975.

Braithwaite, N.St.J., et al., "*An electrostatic probe technique for RF plasma,*" J. Phys. E: Sci. Instrum. 20 (1987) pp. 1046-1049, IOP Publishing Ltd.

International Search Report and Written Opinion dated Aug. 28, 2008 for PCT/US07/12581.

International Search Report and Written Opinion mailed May 11, 2009 for Australian Application No. SG200808896-5.

* cited by examiner

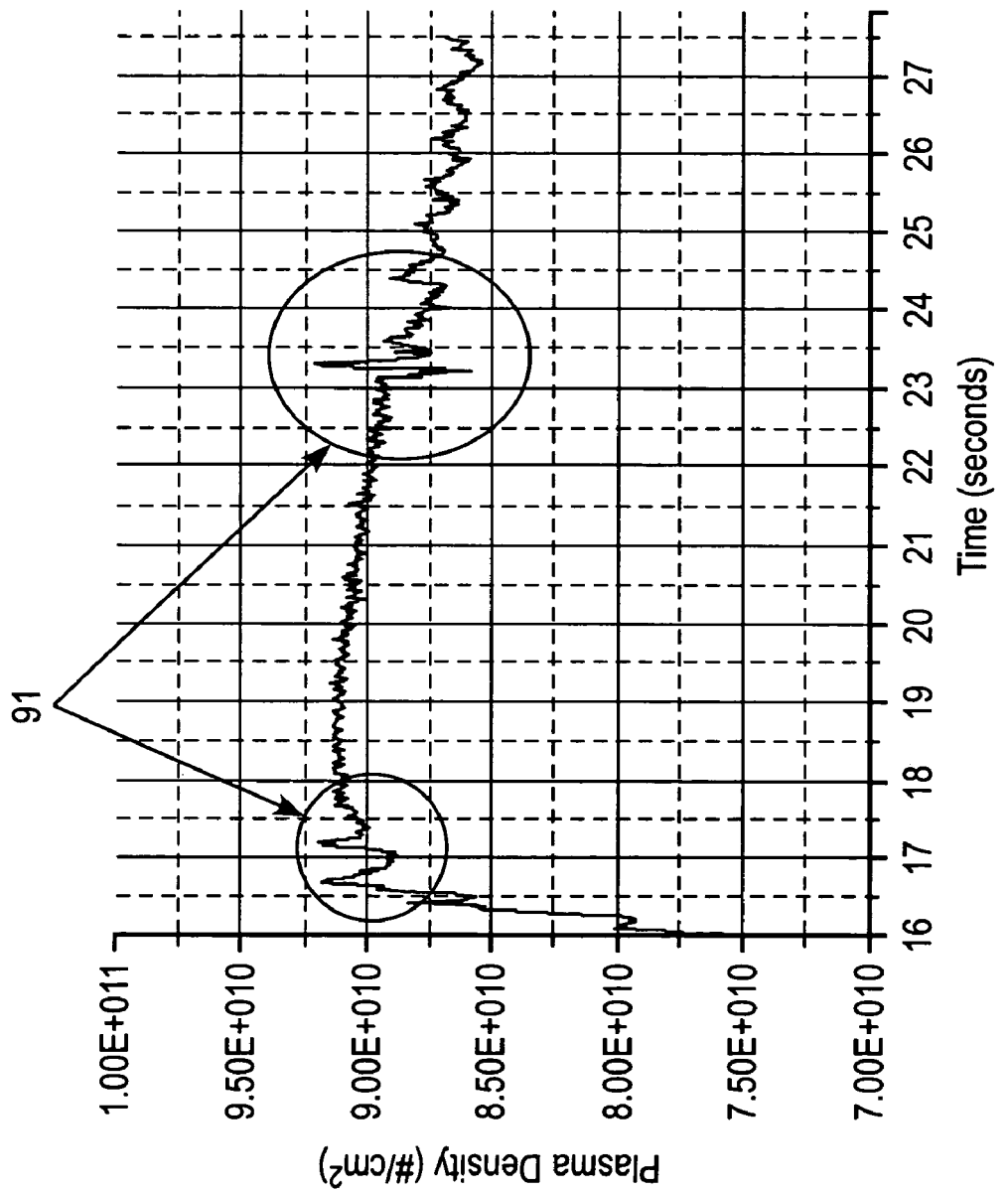

METHOD AND APPARATUS TO DETECT FAULT CONDITIONS OF PLASMA PROCESSING REACTOR

BACKGROUND

With each successive semiconductor technology generation, wafer diameters tend to increase and transistor sizes decrease, resulting in the need for an ever higher degree of accuracy and repeatability in wafer processes. Semiconductor substrate materials, such as silicon wafers, are processed by techniques which include the use of vacuum chambers. These techniques include non plasma applications such as sputter deposition, as well as plasma applications, such as plasma-enhanced chemical vapor deposition (PECVD), resist strip, and plasma etch.

Plasma processing systems available today are subject to a number of specific modes of failure. Many such modes are difficult to detect prior to processing an actual device wafer, and can result in the misprocessing of the wafer. While detection systems exist to diagnose certain aspects of the plasma such as the ion density or the electric field, insufficient methods are available for the detection of faults. Among other things, this calls for plasma chambers with improved uniformity, consistency and self diagnostics. Improved plasma sensing technology which facilitates the achievement of these goals is in great demand.

SUMMARY

According to a preferred embodiment, a method is provided for direct monitoring of a plasma process which includes the steps of initiating a plasma process within a plasma chamber, obtaining plasma parameter data on the plasma process, and evaluating the plasma parameter data for indications of a fault condition wherein the plasma parameter data is obtained by use of a probe wherein a sensing surface of the probe is exposed to the plasma and is coextensive with a wall or component surface within the plasma chamber The method of evaluating plasma parameter data can include storing the data on a computer-readable storage medium system, filtering the data, subjecting the data to an algorithm, and/or comparing the data to existing reference data, which results in an interpretation; and, the issuance of a status report and/or warning based on the interpretation.

Plasma parameters such as ion flux, plasma potential, plasma density, electron temperature, ion species temperature and electron-neutral collision frequency can be measured using various direct probing methods. The methods include the use of a probe wherein a sensing surface of the probe is exposed to the plasma and is substantively coplanar with a wall or component surface within the plasma chamber. Example components include a grounded showerhead electrode, a confinement ring, a liner, a gas distribution plate and a substrate support.

A preferred embodiment of a direct sensor is a Planar Ion Flux (PIF) type. In other embodiments, a direct sensor can be of the non-capacitively coupled Langmuir type, in which a varying voltage is applied directly to the probe surface by a DC power source without use of coupling capacitor, and the current measured. In yet other embodiments, detection systems are used. Types of detection systems include a system that produces a surface wave at a dielectric plasma interface and measuring the plasma density on the basis of the surface wave.

Indications of fault conditions include:

a) a change in the slope of the post-RF ramp of plasma density data to indicate a build-up of process by-products in the process chamber;

b) an oscillation of plasma density after the RF ramp of between about 5% and about 20% of the absolute value of the plasma density to indicate a helium leak;

c) an oscillation in plasma density of amplitude less than 5% of its absolute value and of duration less than 5 seconds, occurring after the RF ramp, to indicate a matching system re-tuning event;

d) stability in the amplitude of plasma density after match tuning takes more than about one half second before returning to its proper equilibrium point, to indicate the occurrence of a poor stabilization rate; and, e) a sudden drop in plasma density by an amount greater than about 15% of its absolute value, followed by a partial recovery, to indicate the occurrence of a loss of plasma confinement.

In other preferred embodiments, where the detector is embedded in a surface within a plasma processing chamber, the detector may include features to enhance compatibility with the surrounding wall surface. For example the detector may be temperature controlled to match the local wall conditions. If the wall contains gas feed through holes, the detector may also be constructed with one or more gas feed-through holes. This would be done by creating at least one gas passage from the sensing surface, through, to the back surface of the probe, positioned to approximate the overall gas distribution pattern that would exist in the absence of the detector.

BRIEF DESCRIPTION OF THE DRAWINGS

FIG. 9 shows an embodiment of the diagnostic method of detecting a match/plasma stabilization rate.

DETAILED DESCRIPTION

Figure 1:
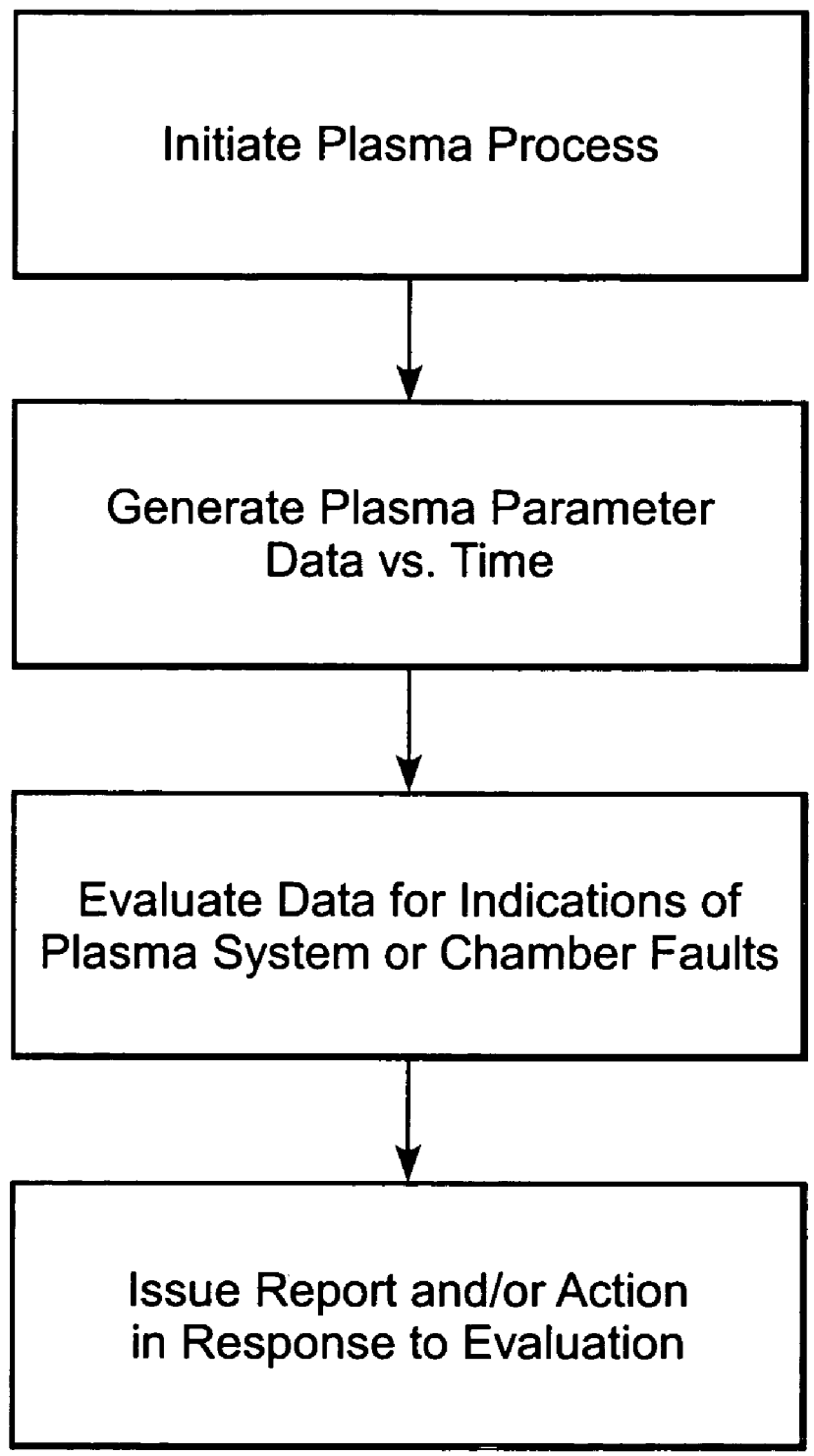
FIG. 1 shows a flow chart of the fault evaluation scheme.

Semiconductor substrate materials such as silicon wafers can be processed in a plasma processing chamber using various plasma processes that include deposition, etching, and resist stripping. A plasma processing system can include a plasma processing chamber, a gas source that supplies at least one process gas into the chamber, and an energy source that produces a plasma by energizing the process gas. A given sequence of steps and input parameter settings for processing a wafer (e.g. RF power, gas flows, start times, etc.) can be referred to as a given "plasma process". Due to the complexity requirements of modern semiconductor manufacturing equipment, typical plasma processing systems are susceptible to various chemical, electrical and/or mechanical failures. These failures include, for example, insufficiently clean processing environments, leaks in vacuum and atmosphere control equipment, loss of process repeatability, and loss of plasma confinement. Often such failures are not detected until a wafer or batch of wafers have been processed.

It has been determined that certain plasma parameters such as ion flux, plasma potential, plasma density, electron temperature, ion species temperature, and electron-neutral collision frequency can be associated with specific faults. Detection of these and other plasma parameters therefore provides a method for detecting and identifying these faults. In a preferred embodiment, the process of plasma parameter detection is carried out without detectable perturbation of the plasma being monitored.

Methods for detection of the plasma parameters during processing can be classified as methods which detect directly and methods which detect indirectly. Indirect methods comprise interpreting signals emitted from the plasma, such as electromagnetic radiation (e.g. optical frequency or radio frequency radiation), and may require certain assumptions in order to extract plasma parameters from the signal, decreasing the reliability of the measurement. Direct methods for detection comprise positioning a detector such that it is directly exposed to the plasma. Interpretation of results from direct methods can involve fewer assumptions, a simpler analysis and greater reliability than interpretation of results from indirect methods. However, the requirement of inserting an object into direct exposure to the plasma being monitored may result in a perturbation to the plasma, and is less acceptable for routine industrial process monitoring. Thus, it would be advantageous to have a method with the preferred reliability of direct detection and the preferred unobtrusiveness of indirect detection. In embodiments, a preferred method comprises direct exposure to the plasma without the insertion of an object into the plasma.

According to a preferred embodiment, a method of fault detection for use in a plasma processing chamber such as a plasma etcher includes direct monitoring using a sensor mounted within a plasma chamber wall or component. A sensing surface of the sensor is exposed directly to the plasma via the plasma sheath that naturally exists in front of the chamber wall or component surface. Perturbation to the plasma (and the plasma sheath in particular) is preferably reduced by surface mounting the sensing device such that the sensing surface is coextensive with the wall or component surface.

Preferably, a fault detection system is operable to collect plasma parameter data as well as evaluate the plasma parameter data for indications of a fault condition. Plasma parameter data can be observed, characterized, compared with a library of known faults ("reference data"), digitized, processed, or analyzed in any way to reveal a specific fault. In a preferred embodiment, the method of evaluating the plasma parameter data includes storing the plasma parameter data on a computer-readable storage medium system and executing an interpretation step. The interpretation step comprises interpreting the plasma parameter data by filtering, subjecting to an algorithm, subjecting to a mathematical operation, and/or comparing the plasma parameter data to existing reference data, resulting in an interpretation. The interpretation step further comprises issuing a status report and/or warning including the interpretation to a wafer tracking system or to the user. Optionally, the status report and/or warning initiates a corrective step in the system, records the event in a log containing wafer history, or stops the processing of the substrate in the plasma chamber. An exemplary methodology is indicated in the flowchart of FIG. 1. The information thus extracted for fault detection is not used to modify the process settings for sequential processing of wafers.

A preferred embodiment comprises using a probe or a sensor to measure a plasma parameter. The probe is disposed within a plasma chamber wall or component, and can be positioned at either a radio frequency (RF) biased or a grounded surface within the reactor such that a sensing surface of the probe is exposed to the plasma. The fault detection system further analyzes the resulting data. Such analysis allows real time diagnosis of failure modes in a plasma processing reactor during the course of wafer processing. A method used by the fault detection system thus comprises initiating a plasma process within a plasma chamber, obtaining plasma parameter data as a function of time from the plasma, and evaluating the plasma parameter data for indications of a fault condition.

Faults can be further classified as chamber faults and system faults. Chamber faults are those faults that occur as a result of an error within the plasma chambers such as a dirty chamber or a mechanical problem, whereas system faults are those faults that occur due to an error initiating outside the process chamber such as problems with the gas feeds or the electrical power sources.

In one embodiment, the detector is a Planar Ion Flux (PIF) probe. A PIF probe is a large-area planar Langmuir probe which is capacitively coupled to a pulsed RF source. The probe sensing surface is preferably larger than the plasma sheath during processing (e.g., the plasma sheath may range from 1 to 5 mm depending on plasma conditions). During the application of an RF burst, a bias voltage is developed across the coupling capacitor. When the RF burst ends, the capacitor then provides a voltage sufficient to bias the collection surface so as to collect ions from the plasma. If the bias is sufficient to achieve a condition known as "ion saturation" the measured current collected during the "ion saturation" portion of the discharge phase divided by the area of the collection surface gives a measure of the ion flux. Furthermore, as the voltage across the biasing capacitor decays, the collected current will also decay. A plot of the voltage vs. current during the entire decay phase results in a characteristic trace which can be analyzed to obtain values for various plasma parameters.

Figure 2:
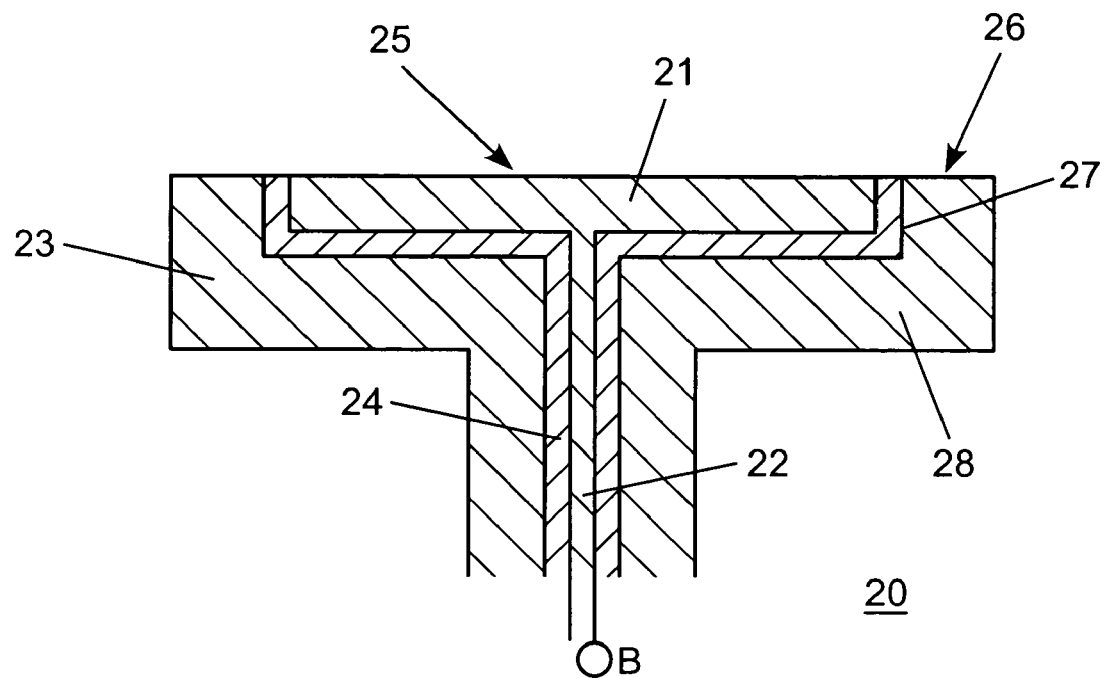
FIG. 2 shows an exemplary embodiment of a PIF probe.

FIG. 2 schematically shows an aspect of a PIF detector for measuring an ion flow according to a preferred method. Probe 20 is comprised of a planar disk 21 connected, by a conductor 22, to a terminal B. The disk 21 has a sensing surface 25, which directly receives and senses the ion flow and has surface area $S_d$. The disk is preferably surrounded with a conductive guard ring 23 to reduce edge effects. Guard ring 23 substantively surrounds planar disk 21 axially and from below. Guard ring 23 has a surface 26 of surface area $S_g$, coplanar to sensing surface 25. Coplanarity of surface 26 and sensing surface 25 is preferably achieved by a vertical wall 27 having a height such that the upper surfaces of the guard ring and the disk are coplanar.

Guard ring 23 comprises a horizontal base 28 which provides physical support for the disk 21 and vertical wall 27, and is of sufficiently large diameter such that disk 21 is surrounded by vertical wall 27. Guard ring 23 also comprises a vertical cylindrical hollow shaft of sufficiently large inner diameter to contain conductor 22 and an insulator 24. The guard ring may comprise a monolithic piece fashioned as shown in FIG. 2, or may comprise two or more separate pieces in electrical contact. The vertical wall 27 and horizontal base 28 surfaces of the conducting disk as well as the conductor 22 are completely insulated from guard ring 23 by an insulator 24. The insulator 24 is continuous, preferably of constant thickness, and of sufficient integrity and dielectric constant to ensure electrical isolation between the disk and the guard ring. The guard ring 23 thus circumferentially surrounds the conductive disk 21 and the conductor 22, but is everywhere electrically insulated from them. An example of a PIF probe and a method of analysis is disclosed in U.S. Pat. No. 5,936,413, the entire content of which is herein incorporated by reference.

Figure 3:
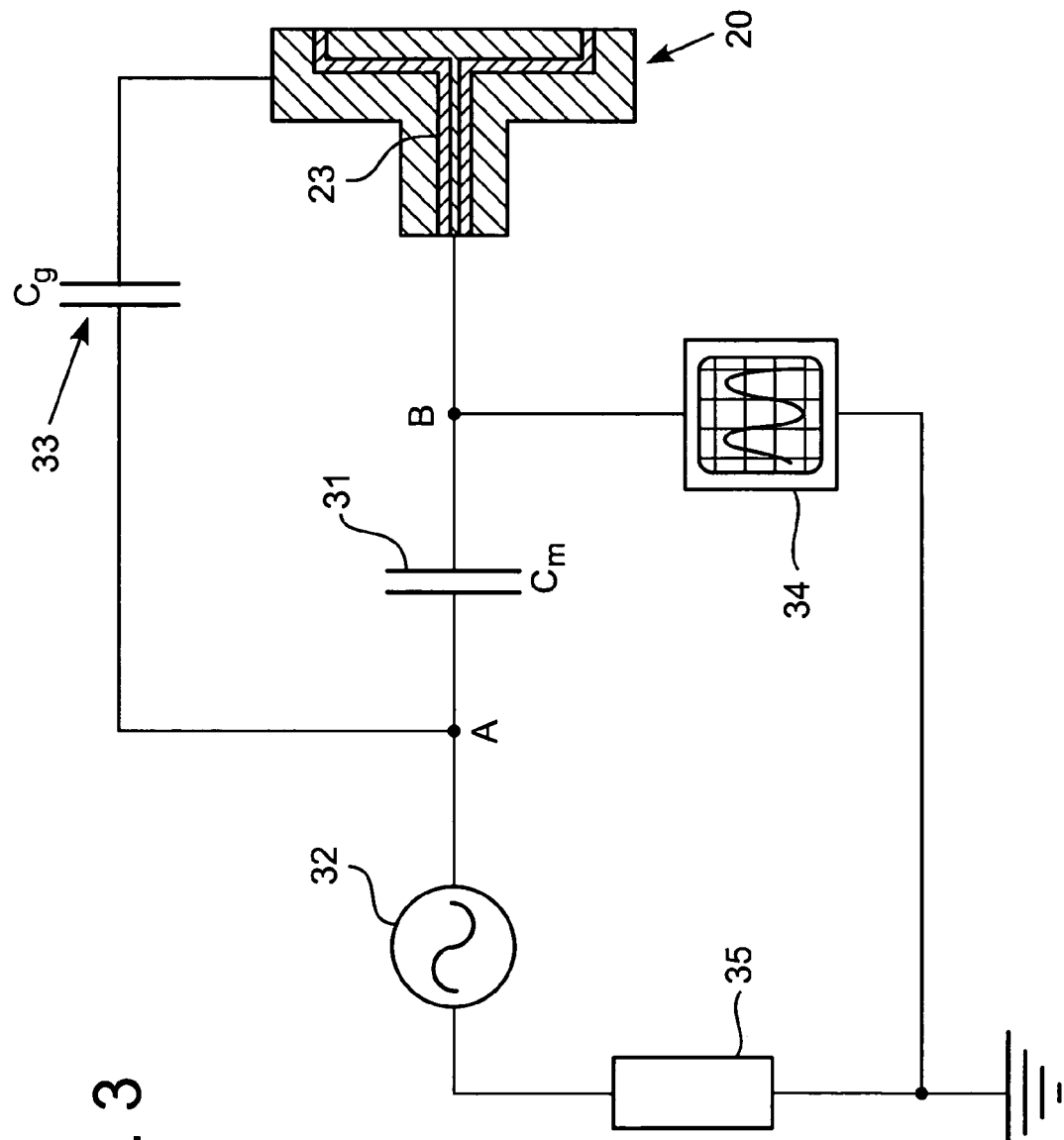
FIG. 3 shows and exemplary schematic of a PIF probe and representative circuitry.

In accordance with the present embodiment, as shown in FIG. 3, disk 21 of probe 20 is connected to node B. Node B is preferably also connected to a high impedance voltage reading device, such as an oscilloscope 34. The other side of the high impedance reading device is connected to ground. Between nodes A and B is connected blocking capacitor 31 which is of value $C_m$. Guard ring 23 is also preferably electrically connected to node A by a capacitor 33 of value $C_g$. Node A is also connected to a first node of a radiofrequency (RF) voltage source 32 having a low output impedance, typically 50 ohms. A second node of RF source 32 is connected to the reactor walls (not shown) and to a reference potential, generally the ground (shown). For the potential of the guard ring to remain close to the probe potential, $C_g$ is preferably chosen such that $C_g/C_m = S_g/S_d$. An optional low impedance current measurement device 35 is preferably maintained in the discharge path of capacitor $C_m$, capable of direct measurement of the discharge current.

Figure 4:
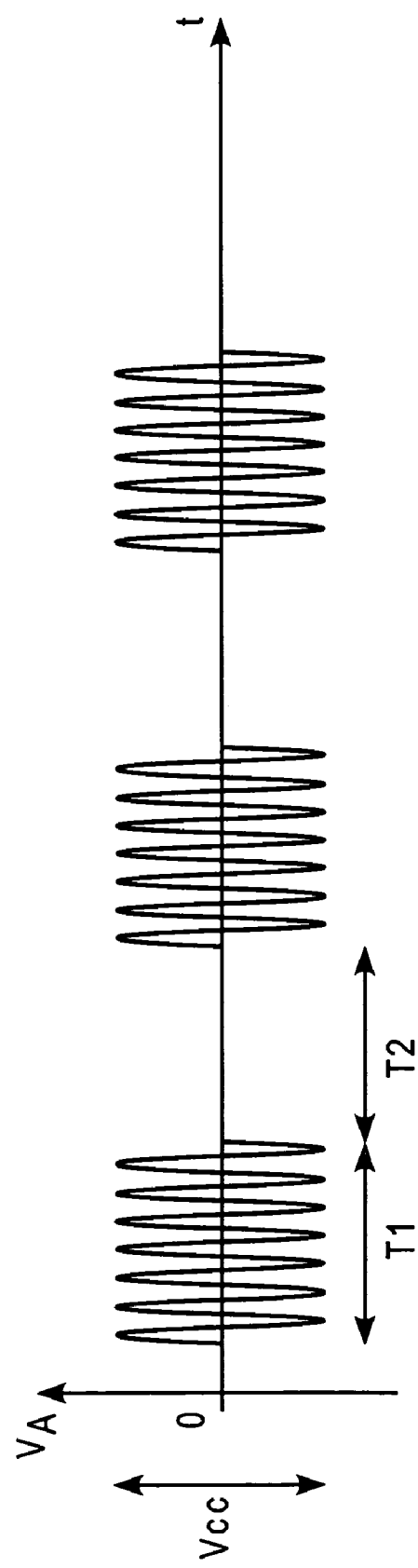
FIG. 4 shows an exemplary RF signal pulse at node A.

Use of a PIF probe for measurement of plasma parameters is sometimes referred to as the Booth and Braithwaite Method. In accordance with this method, node A is pulsed with a sequential series of RF signals, exemplarily shown in FIG. 4. The mean of the pulses is at zero volts, the amplitude is given by $V_{cc}$, their duration by T1, and the delay between pulses by T2. The RF oscillation frequency is preferably different from the excitation frequency of the plasma. For example, if the excitation frequency of the plasma is 13.56 MHz, the RF oscillation frequency may be chosen to be 12.0 MHz.

Figure 5:
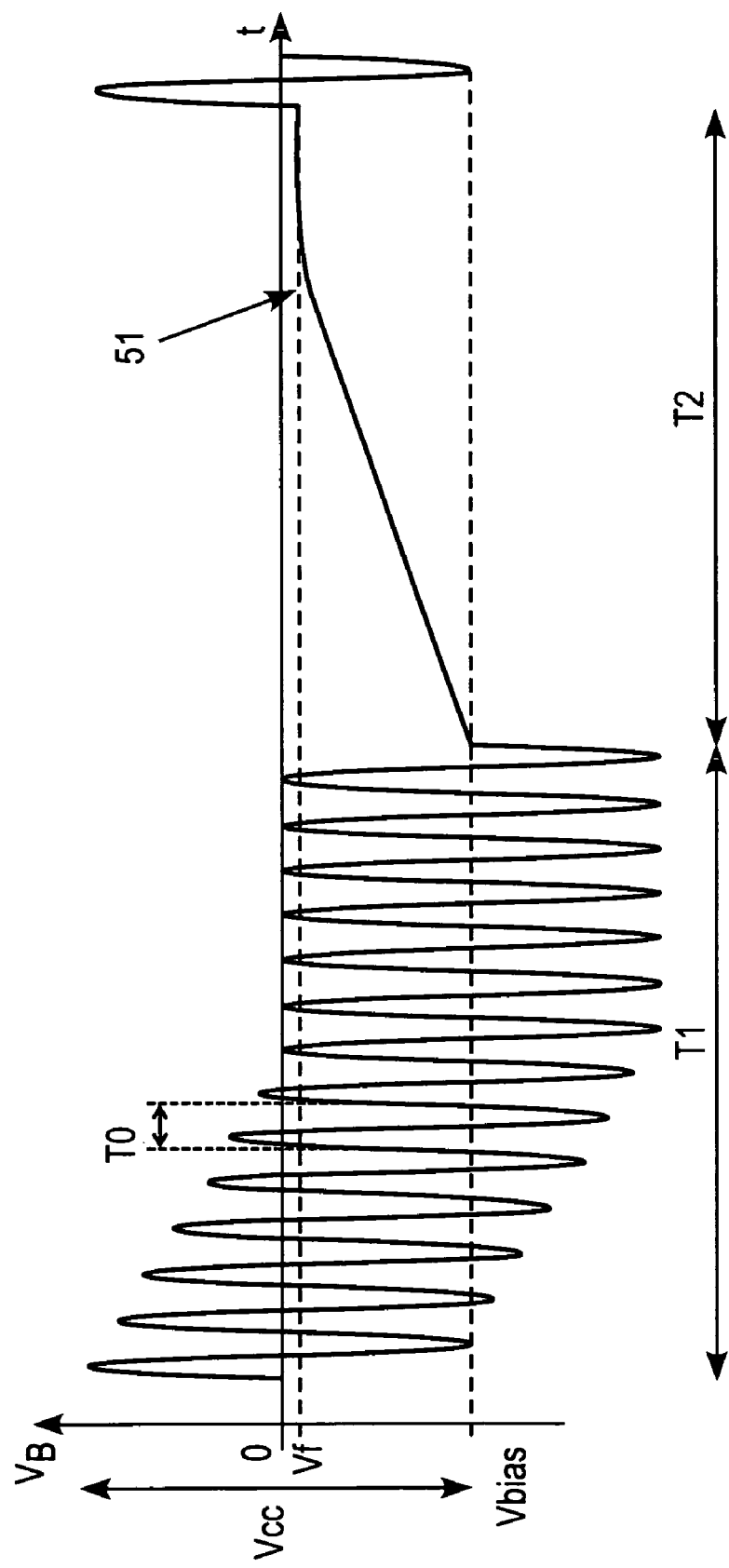
FIG. 5 shows a response signal at node B.

The response at node B of the driving pulse at node A, shown in FIG. 5, is an oscillating signal of the same amplitude $V_{cc}$, the same frequency and the same mean value zero. Under the effect of the RF pulses of source 32, and the effect of the plasma, the mean flow of electrons towards the probe initially exceeds the mean flow of positive ions, causing the charging of capacitor 31. The mean potential of the pulses at node B gradually decreases until reaching a saturation negative value of $V_{bias}$ where electron and ion flux are equal and the mean current is zero.

Then, at the end of a pulse, when the RF signal is cut off, the mean flow of electrons towards the probe is once again restored to balance with the mean flow of positive ions. However, $V_{bias}$ is at a potential sufficiently negative so as to impede the flow of electrons while attracting ions to the collection surface. If $V_{bias}$ is sufficiently high, the system will be in a state known as "ion saturation". The resulting net ion flow starts to discharge capacitor 31. In this state, the potential of node B decreases, initially linearly with time, and a determination of the net ion current per collection area (ion flux) can be made. This can be done by determining $dV_B/dt$ via oscilloscope 33, which is proportional to the ion current according to the equation $$I_B = C_m dV_B/dt.$$

This determination of $I_B$ then serves as a measure of the discharge current.

Alternatively, one may introduce a low impedance current measuring device 35 in the discharge path of capacitor $C_m$. Such a device provides a direct measure of discharge current as a function of time, and can be used as validation of, or as an alternate to, the above determination. The use of a direct measurement technique to determine the discharge current consists of measuring the value of the current during the ion saturation state.

Additionally, either the voltage or current data can be analyzed to determine electron temperature. When the voltage across $C_m$ declines to the point where the system is exiting the ion saturation state 51, the discharge current will exhibit an exponential-like decay until such time as the system returns to a state where the net electron and ion fluxes to the collection surface are balanced (not shown). During this exponential-like decay an analysis of the discharge current (or the voltage across $C_m$) can be performed which results in a measure of the electron temperature of the plasma. In this state, the plasma sheath approaches the floating potential $V_f$.

A single RF pulse and cut-off sequence is therefore sufficient to collect a single measurement of net ion flux or other plasma parameter. Such a measurement can be made over a widely varying period of time, ranging from a few milliseconds to longer periods. For example, a typical burst time might be 3-5 ms and a typical delay time might be 5-10 ms. The collection of a series of these measurements during the course of processing a semiconductor substrate can provide information for the construction of a graph of a given plasma parameter as a function of time.

For a given pulse and cut-off sequence then, the PIF probe directly measures ion flux. In order to determine plasma density, the following relationship is considered. According to plasma theory, for an electropositive plasma, the current is regulated by the Bohm condition. The governing relationship is:

$$J_i = qnv_B \qquad (1)$$

where $J_i$ is the ion current density (i.e. ion flux), q is the fundamental charge, n is plasma or ion density and $V_B$ is the Bohm Velocity, which is given by $$v_B = (kT_e/M_i)^{1/2}. \qquad (2)$$

Here, $T_e$ is the electron temperature in the plasma, and $M_i$ is the ion mass. The relationship between the plasma density and the measured $I_B$ is thus $$n = J_i/(qV_B) = I_B/(S_d qV_B). \qquad (3)$$

Thus, in order to determine plasma density from ion flux data, $T_e$ and $M_i$ must be known. $M_i$ is known from the gas used, and a determination of $T_e$ can be made from the analysis given above, or $T_e$ can be estimated. For example, an estimate of 4 eV can be used.

In another preferred embodiment, the detector is of a non-capacitive type. In the case of a non-capacitive sensor, a voltage is applied directly to the surface by a DC power source without use of coupling capacitor. The voltage is then varied and the drawn current is measured. Standard Langmuir probe theory can then be used to analyze the resulting drawn current vs. voltage data. Aspects of Langmuir probe theory include an analysis of the I-V characteristic of the plasma sheath, that is, the current density flowing to a surface in a plasma as a function of the voltage drop across the sheath. Example plasma parameters that can be extracted from such an analysis include the electron temperature, electron density, and plasma potential. In certain circumstances ion density, the ion temperature, and the electron energy distribution function can be determined as well. The preferred geometry of a non-capacitive type sensor is planar.

In yet further preferred embodiments, other detection systems can be used, such as a system which includes producing a surface wave at a dielectric plasma interface and measuring the plasma parameters on the basis of the surface wave. Example plasma parameters that can be extracted from such a system include plasma density. Such a system is disclosed in U.S. Pat. No. 6,541,982, the entire content of which is herein incorporated by reference. Additional exemplary detection systems include electrical methods, such as the "Hercules" plasma monitoring system, which is based on Self Excited Electron plasma Resonance Spectroscopy (SEERS). The Hercules method uses a coaxial sensor inserted into the wall of a chamber where it acts as part of the chamber wall. Use of the Hercules method can determine plasma parameters such as electron collision rate, electron density, and bulk power.

In a preferred embodiment, the method thus comprises detecting at least one plasma parameter in real-time, plotting the at least one plasma parameter as a function of time, and assessing the plot or plots to identify chamber or system faults. Alternatively, the plot or plots can be compared to a library of known faults to identify the associated fault. Once a fault is detected, the operator or wafer control system is optionally informed. The information can be in the form of a warning or an alert to an operator, for example by displaying an informative message on a monitor used to operate the chamber, or by logging the system used to operate the chamber as "down". Alternatively, the information can be stored in a wafer tracking system or other database for later evaluation.

In embodiments, the use of a plurality of sensors mounted at various sites within the chamber can provide a measure of the uniformity of given plasma parameters. A real-time measure of plasma uniformity may provide additional fault detection schemes and enable improved self diagnostics.

A number of examples of fault detection in a plasma processing chamber according to a preferred embodiment are hereby illustrated. In all cases, a PIF probe was embedded in the center location of a showerhead electrode of an Exelan 2300™ plasma etch system to be able to collect plasma parameter data during the processing of semiconductor wafers. Wafers were processed using common etch recipes and data was collected at a nominal frequency of one measurement every 30 ms (about 33 measurements/second). In these examples, the plasma parameter determined was plasma density, which in each case was plotted as a function of time. Because of the high rate of data collection, the plotted data points appear to be a solid line. In the example plots, data collection is generally cut off at about 27 seconds due to a hardware limitation. Recipes used in examples 1 through 6 include etch processes within the range of the following conditions: Chamber pressure: 50-150 mtorr, 2 MHz RF power: 2600-3600 W, 27 MHz RF power: 1700-2500 W, gas used: Ar at 250-350 sccm, $C_4F_8$ at 13-23 sccm, $O_2$ at 4-12 sccm.

EXAMPLE 1

Various processes can be carried out in a plasma processing chamber. Etch and resist stripping processes are typically performed in a plasma environment and it is desirable to perform both processes consecutively within a single plasma chamber. The ability to perform different plasma processing steps in the same chamber is considered advantageous, as overall processing time ("cycle time") can thereby be reduced. When different plasma processing steps are consecutively carried out in the same chamber, the residue from one process step is preferably completely removed before beginning the next process step. Complete residue removal promotes process consistency and reduces "process memory'—a residue build-up effect that causes drift in process performance on a wafer-to-wafer basis.

It would therefore be advantageous to have a method to determine a chamber fault condition corresponding to when chamber cleaning is required. Such a method would promote the determination of an optimal cleaning schedule, and would allow the user to look for correlations between on-wafer process or device performance and chamber conditions. Cleaning the chamber too frequently can decrease productivity, whereas cleaning the chamber too infrequently can result in process drift.

Figure 6A:
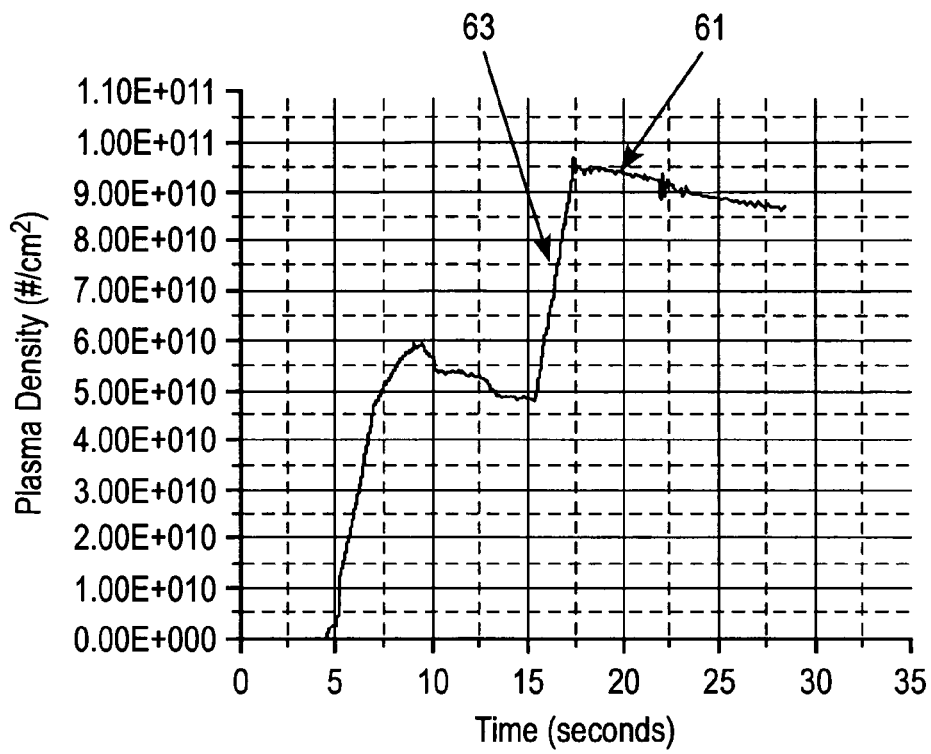
FIG. 6 shows an embodiment of the diagnostic method of detecting the need for a chamber clean.
Figure 6B:
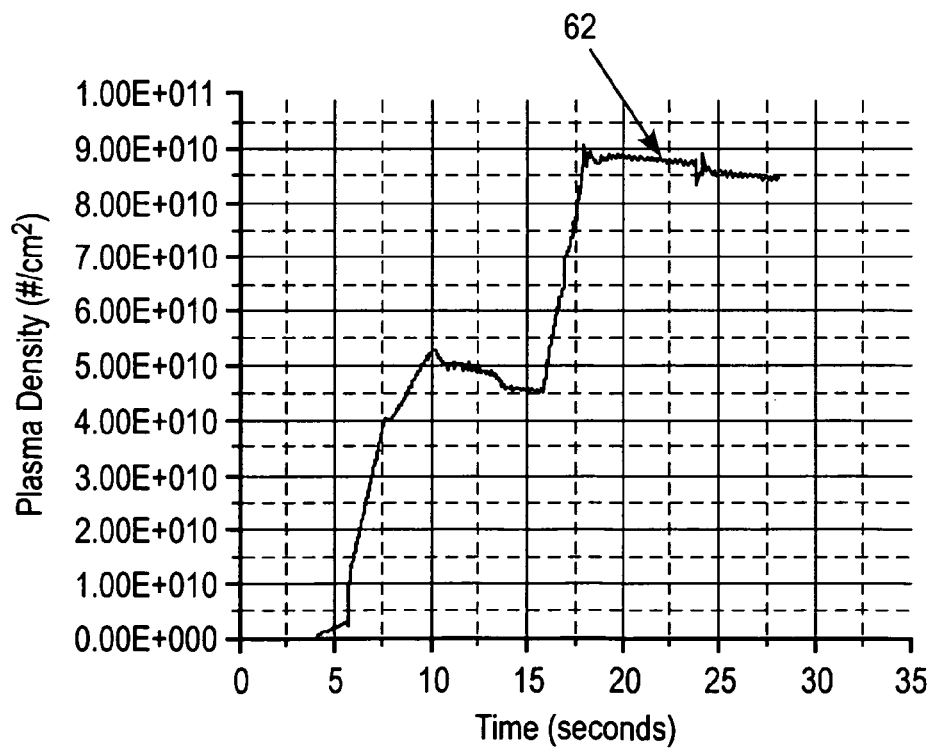

A first analysis of plasma parameter data is provided in FIGS. 6a and 6b. FIG. 6a shows plasma density as a function of time during the processing of a wafer in a clean chamber. The data shows a decreasing slope 61 following the RF ramp 63 and achievement of the highest plasma density (at about 17.5 seconds). FIG. 6b shows the same curve for a wafer processed in the same chamber after approximately an additional 50 wafers had been processed. The data shows a very similar curve, but the slope of the data following the RF ramp is flatter 62, i.e. it has a less negative slope. The less negative slope is indicative of a polymeric, fluorocarbon-based by-product build-up in the process chamber of the type normally seen in plasma etch processes, and indicates that a chamber clean is required to restore the system to its original process condition.

In a preferred embodiment, this condition can identify a chamber fault, as when the absolute value of the slope of the post RF ramp data numerically falls below a certain value. Thus, by carrying out this method it is possible to identify a chamber fault due to loss of chamber cleanliness. In other embodiments, the slope of the post RF ramp data can be used as an indicator of chamber cleanliness by establishing a relationship between the slope and process performance characteristics. In this way, the state of the chamber can be monitored and a determination made as to when a fault can be anticipated.

In alternative embodiments, a measured amount of polymer is deliberately deposited on the chamber wall surfaces prior to implementation of an etch process. Such a procedure is called "chamber conditioning". The method detailed above in which the absolute value of the slope of the post RF ramp data numerically falls below a certain value, could be used to identify a chamber fault that a chamber is not ready for an etch process to begin.

EXAMPLE 2

During the course of periodic maintenance and other repairs, plasma chambers may be disassembled for cleaning, repair or upgrading. Since process conditions in the plasma chamber are carried out under high vacuum, the proper assembly of the chamber after maintenance is critical. During assembly, bolts used to secure the chamber and elements within the chamber should be properly tightened, often in the correct sequence, in order for the chamber to perform optimally. Improper tightening of bolts in a showerhead electrode assembly incorporating helium passages or in a bottom electrode having helium passages for wafer back-cooling can lead to helium "light-up" during plasma processing, wherein the backside helium is inadvertently introduced into the chamber during plasma processing and ionizes, forming a plasma.

Figure 7A:
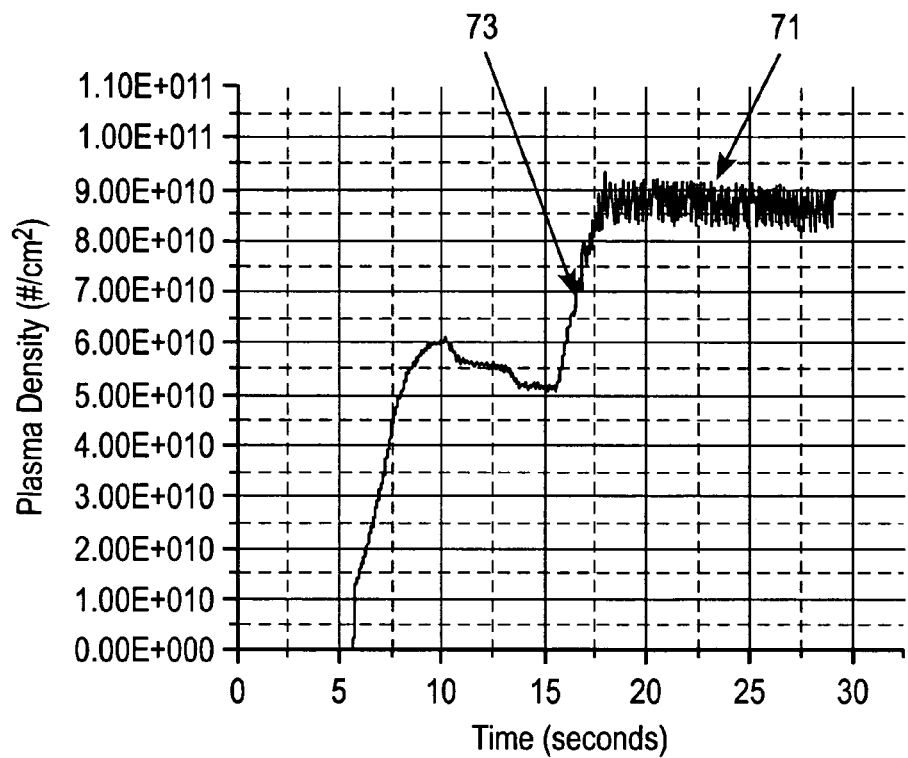
FIG. 7 shows an embodiment of the diagnostic method of detecting Helium "light-up" due to improperly installed electrode assembly bolts.
Figure 7B:
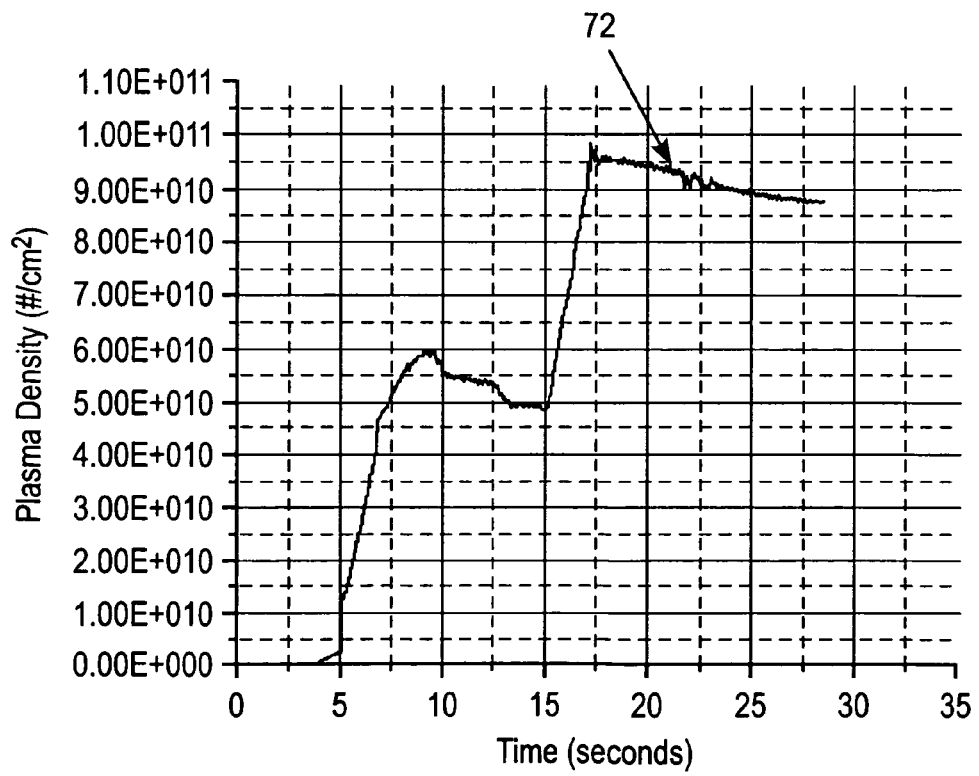

A second analysis of plasma parameter data is thus provided in FIGS. 7a and 7b. FIG. 7a shows plasma density as a function of time during the processing of a wafer in which the chamber is suffering from bottom electrode bolts which had been tightened incorrectly, resulting in a helium leak. The data shows an oscillation 71 after the RF ramp 73 on the order $8\times10^9$ ions/cm$^3$, about 10% of the absolute value of the plasma density. This oscillation of the plasma was not visually apparent. FIG. 7b shows the same curve for a wafer processed in the same chamber after the electrode bolts were corrected for tightness. The data shows a very similar curve, but the post RF ramp oscillation has been substantially eliminated 72. In a preferred embodiment, this condition, classified as a chamber fault, can be used to alert the operator as to the condition of the chamber or stored in a database. Thus, by carrying out this method it is possible to identify a chamber fault due to a helium leak.

EXAMPLE 3

For process consistency from wafer to wafer, it is desirable that the processing chamber undergo the same sequence of steps for each wafer. For example, clamping voltages preferably have the same magnitude and are applied for the same duration each time a wafer is processed. Gas flows must achieve the set flow rates and durations, and process step durations and plasma conditions during those durations must be reproduced to a high degree of accuracy in order to assure consistent wafer to wafer processing. It is therefore undesirable for a parameter of the system to shift during processing if it is expected to remain constant. In particular, after an RF matching system finds a desired tune point, it is expected that the system should hold that point throughout the etch step. Random re-tuning of the matching system during an etch step can result in uncontrolled process variation.

Figure 8A:
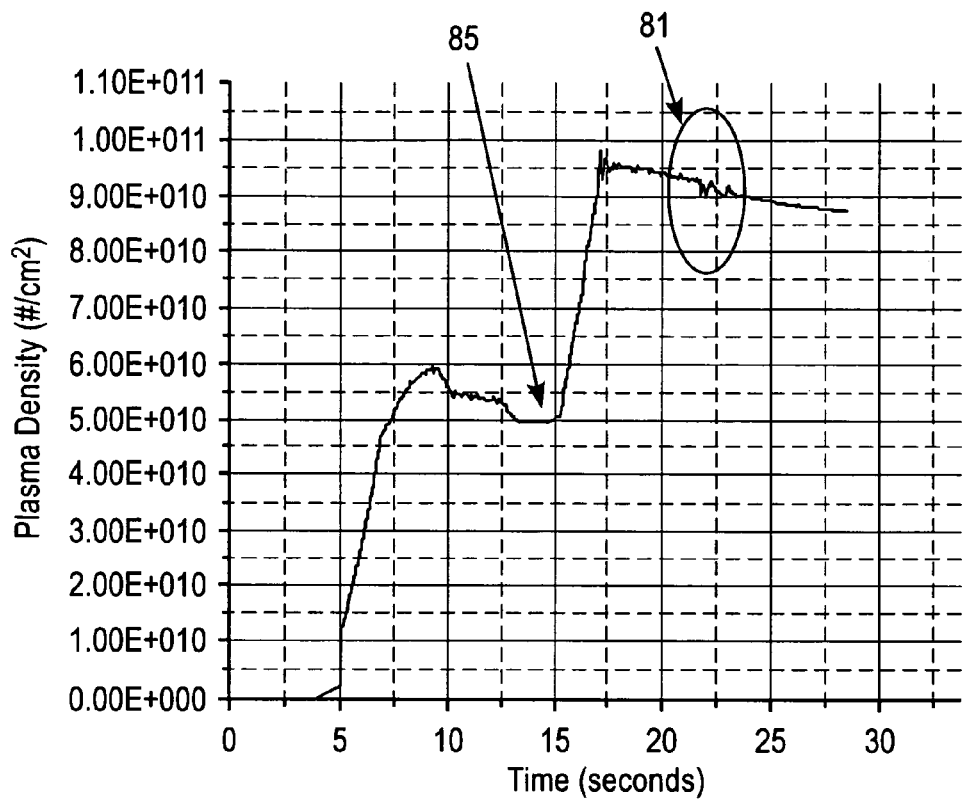
FIG. 8 shows an embodiment of the diagnostic method of detecting a match "re-tune" event.
Figure 8B:
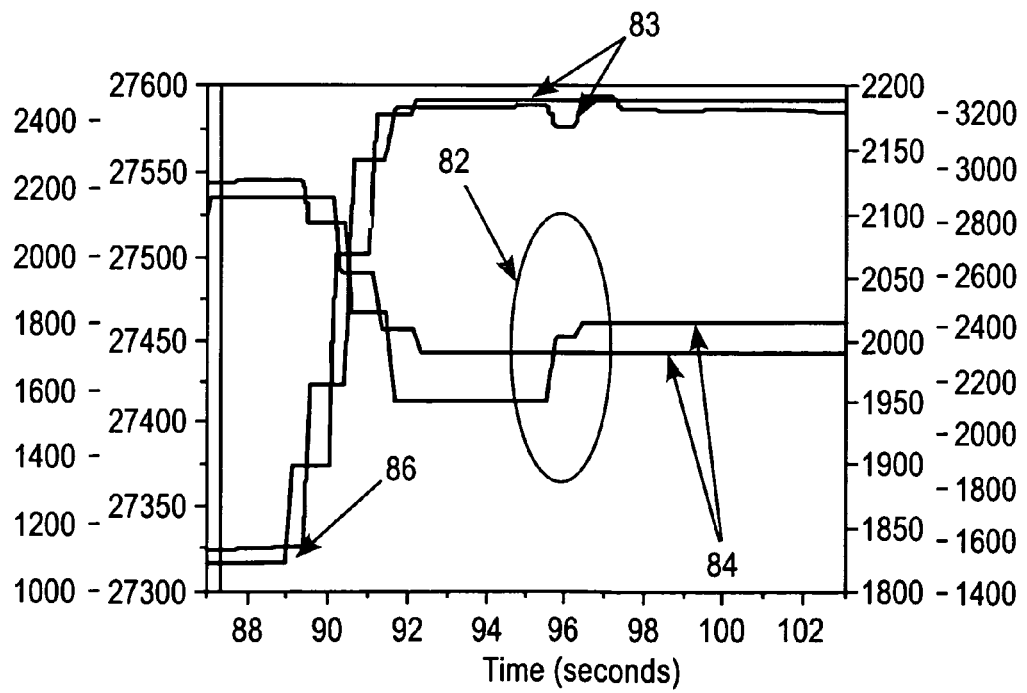

A third analysis of plasma parameter data is thus provided in FIGS. 8a and 8b. FIG. 8a shows plasma density as a function of time during the processing of a wafer, in which the matching system is re-tuned. In this example, the re-tuning occurred about 7 seconds after initiation of the RF ramp 85 and during the post-RF ramp period, resulting in a short oscillation in the data 81. The amplitude of the oscillation in plasma density is less than 5% of the absolute value of the plasma density, and the duration is less than 5 seconds. The event is confirmed in the screen image of FIG. 8b as a matching system re-tuning event. FIG. 8b shows a first set of two curves 83 indicating the 2 MHz and 27 MHz RF source frequencies as a function of time, and a second set of two curves 84 indicating the 2 MHz and 27 MHz RF forward power in Watts. The jump observed in the 2 MHz forward power 82 at a time corresponding to about 7 seconds after initiation of the RF ramp 86 confirms the re-tuning event seen in FIG. 8a.

In a preferred embodiment, this condition, classified as a system fault, can be used to alert the operator or wafer tracking system that the specific wafer being processed has experienced a re-tuning during processing. For example, from a determination that matching system re-tuning events occur at random times during the course of non-sequential processes, it can be determined that a system fault exists, requiring the examination of the plasma system. The detection of an arbitrary matching system re-tuning event indicates that a hardware failure or other type of failure could be occurring. Thus, by carrying out this method it is possible to identify a system fault due to the occurrence of a matching system re-tuning event. In response, the operator may stop processing and initiate a maintenance procedure.

EXAMPLE 4

For process consistency and chamber diagnostics, additional elements about the system may be useful. A desirable characteristic of any system is stability. During the course of an etch process, perturbations to the plasma may result in a process error such as a variation in the etch rate. This could be due to malfunctioning mass flow controller or other hardware error. Another desirable characteristic is a fast stabilization rate. After a perturbation, a system should quickly return to its proper equilibrium point. Excessive delay in the restoration process is also characteristic of a fault requiring investigation of the plasma generation hardware.

A fourth analysis of plasma parameter data is thus provided in FIG. 9. Similar to the other graphs discussed above, the FIG. 9 graph shows plasma density as a function of time, but in this case, the scale is shifted and expanded, so that only the 11 seconds after the RF Ramp is shown. An oscillation showing match tuning is present at around 17 seconds, as shown at 91, which shows that stability after tuning took about one full second. The figure also shows a re-tuning event which lasted only about 0.5 seconds.

In a preferred embodiment, this condition can be used to establish certain characteristics about a plasma system or an individual plasma system. Such characteristics may be useful for chamber-to-chamber characterization and identification of imperfections in individual chambers. Causes of this condition include malfunction of hardware related to maintaining plasma confinement and maintaining the set gas flows. Upon detection of this fault, the wafer processing may be stopped and the wafer scrapped. Differentiation between match tuning and re-tuning events can be established by correlation with other sensors. In the event where other sensors record relevant matching data at lower frequency, for example 0.1 Hz, then the event can be understood to be re-tuning event. Thus, by carrying out this method it is possible to identify a system fault due to the occurrence of a poor stabilization rate.

EXAMPLE 5

Another desirable characteristic of any system is that the plasma characteristics remain constant wafer-to-wafer. Plasma density and ion flux are primary among such characteristics. Should a chamber fault event occur during processing in which the plasma density or ion flux shifts, adverse effects on wafer processing may occur. In particular, it is known that etch rate may be affected.

Figure 10:
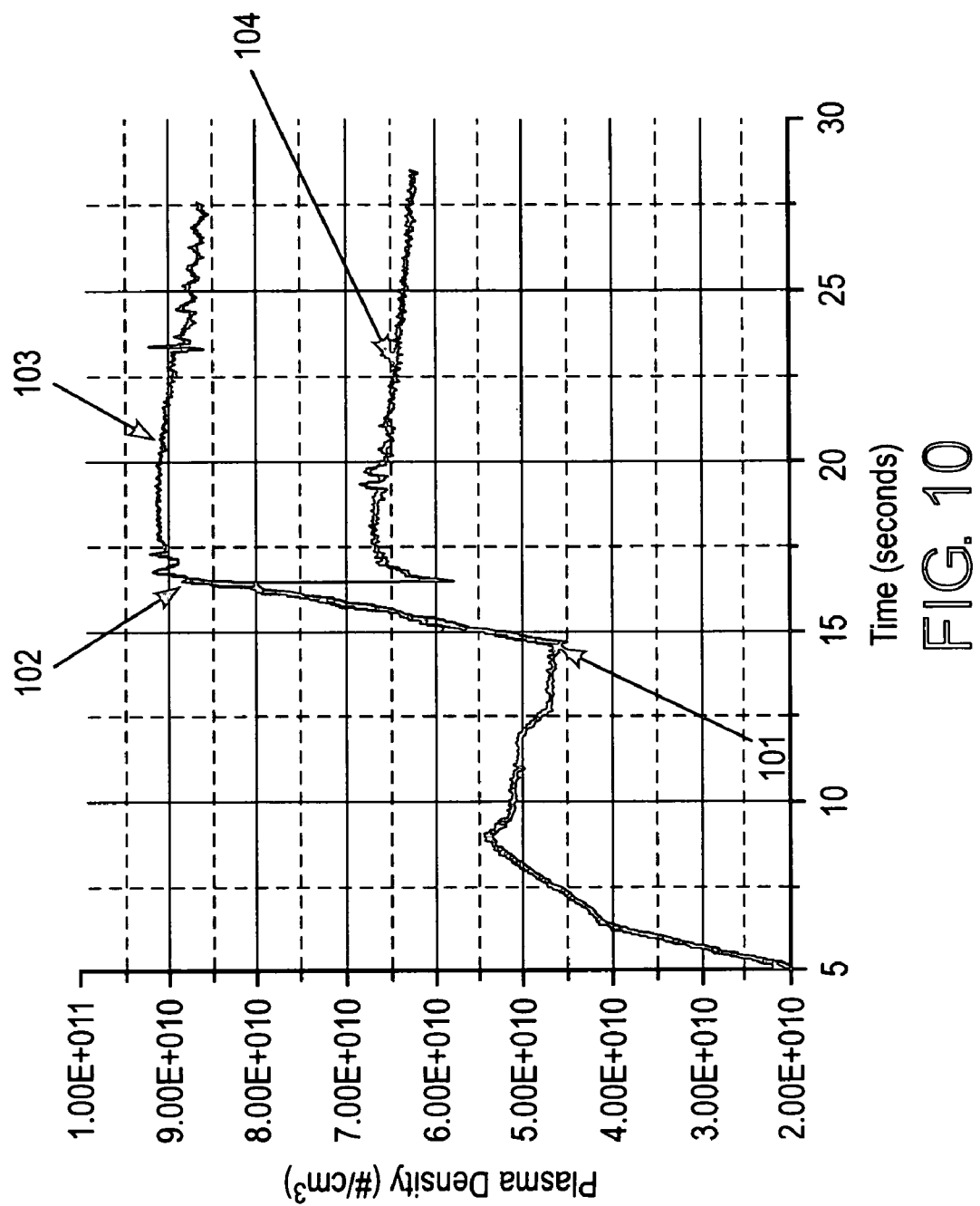
FIG. 10 shows an embodiment of the diagnostic method of detecting loss of plasma confinement.

A fifth analysis of plasma parameter data is thus provided in FIG. 10. In this case, the graph shows plasma density as a function of time for two wafers processed consecutively. The wafers are referred to as "wafer n", represented by data curve 103, and "wafer n+1", represented by data curve 104 (spurious data points for wafer n+1 have been removed). The curves are overlapping and effectively indistinguishable from the point in time where data begins, at 5 seconds, through the onset of the RF ramp, shown at 101, which occurs at about 14 seconds. During the RF ramp of wafer n+1, occurring at about 17 seconds, the plasma goes unconfined, i.e. a leak of the plasma through the confinement rings occurs. This is reflected by a sudden drop in the plasma density, shown at 102, followed by a partial recovery. The drop in plasma density exceeds 15% of the absolute value of the plasma density. It can be seen that the remainder of processing for wafer n+1 as shown at 104 occurs at a lower plasma density than the plasma density occurring during the processing of wafer n for the same period in the process sequence 103. A possible outcome of such a decline in plasma density is a poorly processed or misprocessed wafer.

In a preferred embodiment, this condition, which may be a chamber fault or a system fault, can be used to establish certain characteristics about an individual plasma chamber. Such characteristics may be useful for chamber-to-chamber characterization as well as for identification of imperfections in individual chambers. Causes of this condition include malfunction of hardware related to maintaining plasma confinement or gas flows, dirty chamber conditions, and a wafer with undesirable material on the surface, such as a contaminant in a resist film. Upon detection of this fault, the wafer processing may be stopped and the wafer scrapped. Thus, by carrying out this method it is possible to identify a fault due to loss of confinement.

The analysis of plasma parameter data can also be used to identify lack of chamber matching in a group of plasma chambers running the same process recipe on the same type of wafer, or for ensuring that a new chamber or one that has been cleaned or subject to maintenance matches or meets certain chamber qualification specification. For example, a group of process chambers may be structurally identical and operated by the same process conditions and it may be desirable to compare the performance of such chambers under operating conditions using the data obtained with the PIF probe. Thus, by carrying out the chamber matching it is possible to identify a chamber which may not be performing adequately.

Figure 11:
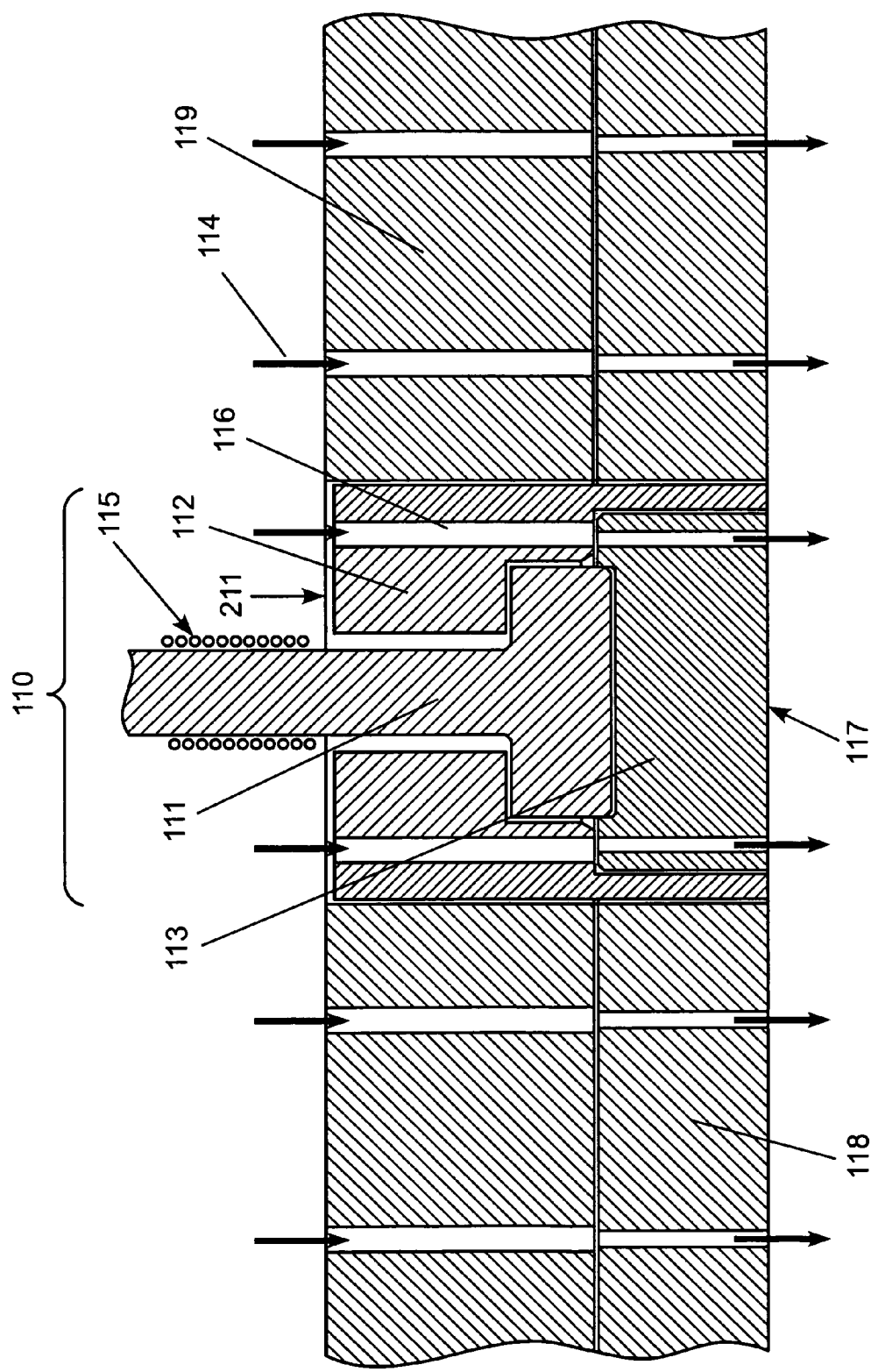
FIG. 11 shows an embodiment of a PIF probe disposed in an upper electrode of a plasma processing chamber.

In a preferred embodiment, plasma parameters are obtained by use of a probe having a sensing surface exposed to the interior of a plasma chamber, and more preferably wherein the probe is embedded in a chamber wall or component of the plasma chamber, such as a grounded electrode. A exemplary schematic depiction of a PIF probe such as that shown in FIG. 2, embedded in the inner electrode part of a multi-piece showerhead electrode assembly, is shown in FIG. 11. The probe 110 is preferably positioned such that a sensing surface 117 of a planar disk 113 is coextensive (e.g., coplanar) with the showerhead electrode 118, so that the probe will have minimal impact on the plasma. The probe comprises a conductor 111 made from a material such as aluminum or graphite. In order to establish the electrical circuit necessary to operate the probe, such as that shown schematically in FIG. 3, an electrical connection to the probe, conductor 111 preferably traverses the chamber containment, from inside the chamber to outside the chamber, through a wall, window, vacuum feed-through or connector (not shown). Those skilled in the art will understand that probe 110 corresponds to probe 20, planar disk 113 corresponds to planar disk 21, and conductor 111 corresponds to conductor 22. Guard ring 23 and insulator 24 of FIG. 2 correspond to insulator 112 in FIG. 11.

Conductor 111 is surrounded by an electrical insulator 112 to electrically isolate the probe from the electrode assembly. Insulator 112 is preferably made from an insulating material such as quartz, and has a surface comprising the back of the probe 211. Perturbation to the plasma and the plasma sheath is preferably reduced by making the planar disk 113 from the same material used to make the showerhead electrode, such as silicon. Furthermore, if electrode 118 is doped to a given resistivity, planar disk 113 is preferably doped to the same resistivity, but may also be doped to a different resistivity, if desired. For example, if the quartz insulation 112 is perturbing the RF path, a constant RF path may be better achieved with a doping level for disk 113 that is different than the doping level of electrode 118. If desired, the probe 110 can be mounted in other chamber surfaces and/or the sensing surface 117 can be covered with a dielectric coating compatible with the plasma processing conditions, e.g., the disk 113 could be of aluminum or aluminum alloy with an anodized layer on surface 117.

In order to further achieve minimal impact of the probe on the plasma, the temperature of the probe and the gas flow around the probe can be modified. In particular, the probe is preferably heated, using, for example, a temperature control component 115. Component 115 can be an electrical resistance heater or can be a tube for circulating a temperature controlled fluid which can heat or cool. An electrical resistance heater could be powered by an AC or DC power source (not shown). Heating can be controlled by a temperature controller (not shown), set so that the temperature of sensing surface 117 is the same as the temperature of the showerhead electrode.

The gas flow normally provided by gas feed-through holes 114 can be disturbed due to the presence of the probe. The disturbance to the gas flow and thus the plasma is preferably minimized with the use of one or more optional gas feed-through holes 116 in the probe creating a gas passage to a common plenum (not shown) that supplies gas to a graphite backing plate 119 located behind the electrode. The collinear gas passages 116 in the quartz insulator and the planar disk 113 form continuous gas passages, and are preferably positioned to approximate the overall gas distribution pattern that would exist in the absence of the probe. In a preferred embodiment, the gas passages are positioned in the probe where they are normally located in the showerhead electrode in the absence of the probe.

Figure 12:
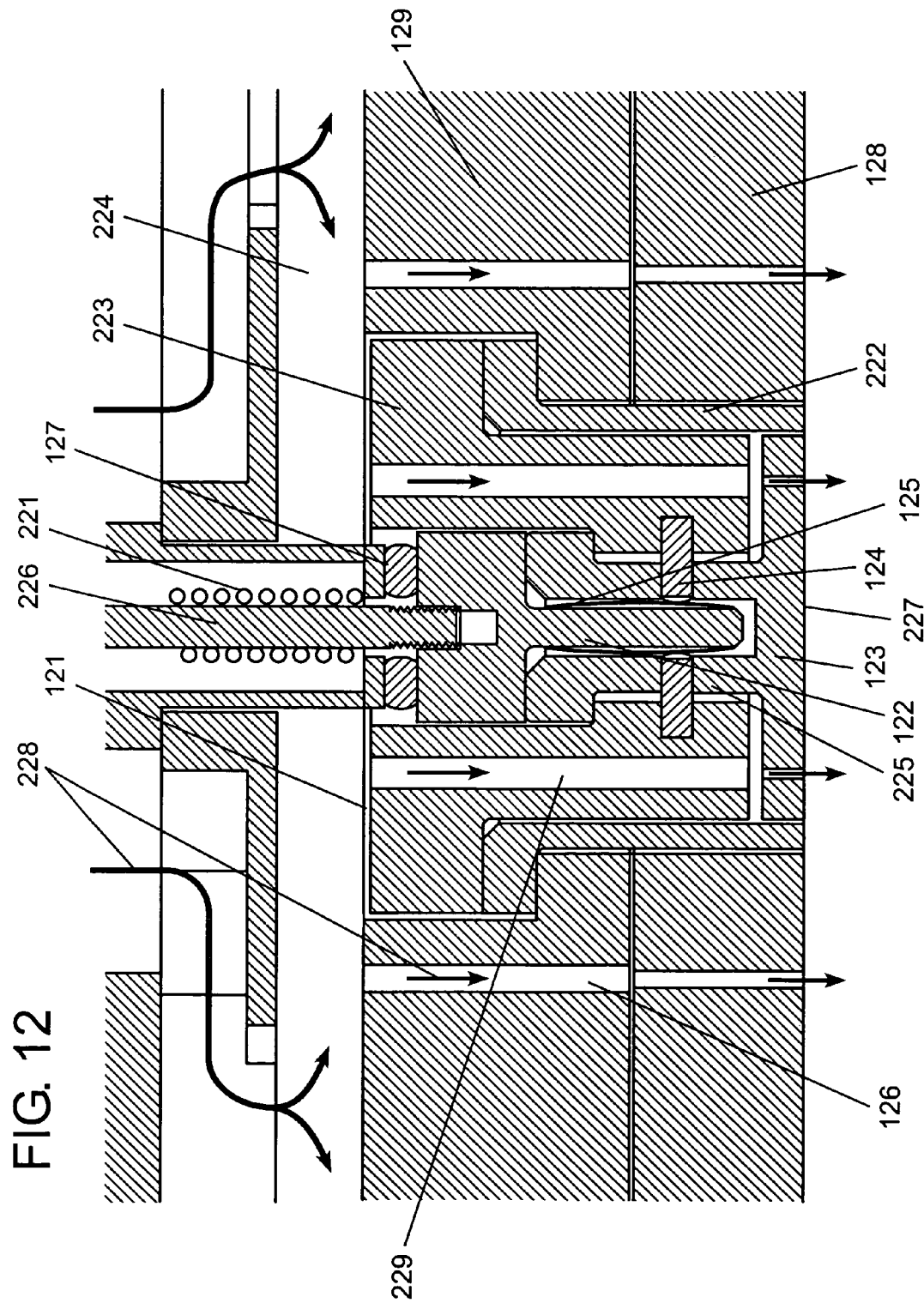
FIG. 12 shows an alternative embodiment of a PIF probe disposed in an upper electrode of a plasma processing chamber.

A schematic depiction of an exemplary alternative embodiment of a PIF probe embedded in the inner electrode part of a multi-piece showerhead electrode assembly is shown in FIG. 12. Planar disk 113 has been adapted to reduce parasitic capacitance by reducing the thickness of the sensing surface. Planar disk 123 has a tubular extension 225 adapted to receive and work cooperatively with conductor 122 to promote alignment and conductivity. Planar disk 123 and conductor 122 communicate mechanically and electrically through a conductive leaf spring 125. Leaf spring 125 also improves ease of assembly, for example, by enabling the independent removal of planar disk 123 without removal of other parts of the probe.

Conductive threaded bolt 226 enables advancement of planar disk 123 to compensate for any differential wear rate between disk 123 and exposed silicon surface 227, due to long term exposure to the plasma environment. Due to the presence of seal 127 of compressible material (e.g., an O-ring), the bolt 226 can be advanced or retracted within limits of expansion or compression of seal 127 to thereby move the surface 227 to a desired position. To ensure that gas feed-through holes in the probe remain in alignment, one or more keys or pins 124 ensures that torque supplied to planar disk 123 as a result of advancing conductive threaded bolt 226 will not rotate planar disk 123 with respect to insulator 223. To install the keys or pins 124, the surrounding dielectric material 223 is preferably in two parts which fit around the tubular extension 225. Preferably, planar disk 123 and conductor 122 are surrounded by insulator 223 which serves to electrically isolate probe 123, conductor 122 and threaded bolt 226 from electrode 128 and graphite backing plate 129. In order to establish the electrical circuit necessary to operate the probe, an electrical connection to the probe through conductive threaded bolt 226 preferably traverses the chamber containment, from inside the chamber to outside the chamber, through a wall, window, vacuum feed-through or connector (not shown).

Insulator 223 also serves to support planar disk 123 and maintain its orientation towards the chamber interior. Insulator 223 thus comprises a back surface of the probe 121. Electrical isolation of the probe from the electrode assembly is completed by outer insulator 222, which is in the shape of a cylindrical tube with an upper shoulder which fits within a recess in the upper side of backing plate 129. A similar shoulder on insulator 223 rests on the upper shoulder of insulator 222, while insulator 222 surrounds and is in intimate contact with insulator 223. Outer insulator 222 extends to and has a surface coplanar with the lower surface of electrode 123 and sensing surface 227. During exposure to the plasma, outer insulator 222 can experience wear. Advantages of an outer insulator include a reduction in the size and complexity of parts that must be replaced due to wear resulting from exposure to the plasma environment.

Gas flow 228 through the probe is effected by gas feed-through holes 229. Collinear gas feed-through holes in the quartz insulator and the planar disk form continuous gas passages. The gas passages are preferably positioned to approximate the overall gas distribution pattern that would exist in the absence of the probe. In a preferred embodiment, the gas passages are positioned in the probe where they are normally located in the showerhead electrode in the absence of the probe.

O-ring 127 is used to maintain position and electrical isolation of the conductor 122 from portions of the showerhead assembly. O-ring 127 and key 124 are preferably made of a nonconductive, heat-resistant and mechanically resilient material such as Teflon. A temperature control component 221 can be an electrical resistance heater or a tube for circulating a temperature controlled fluid which can heat or cool the probe to match surrounding part temperatures.

Figure 13:
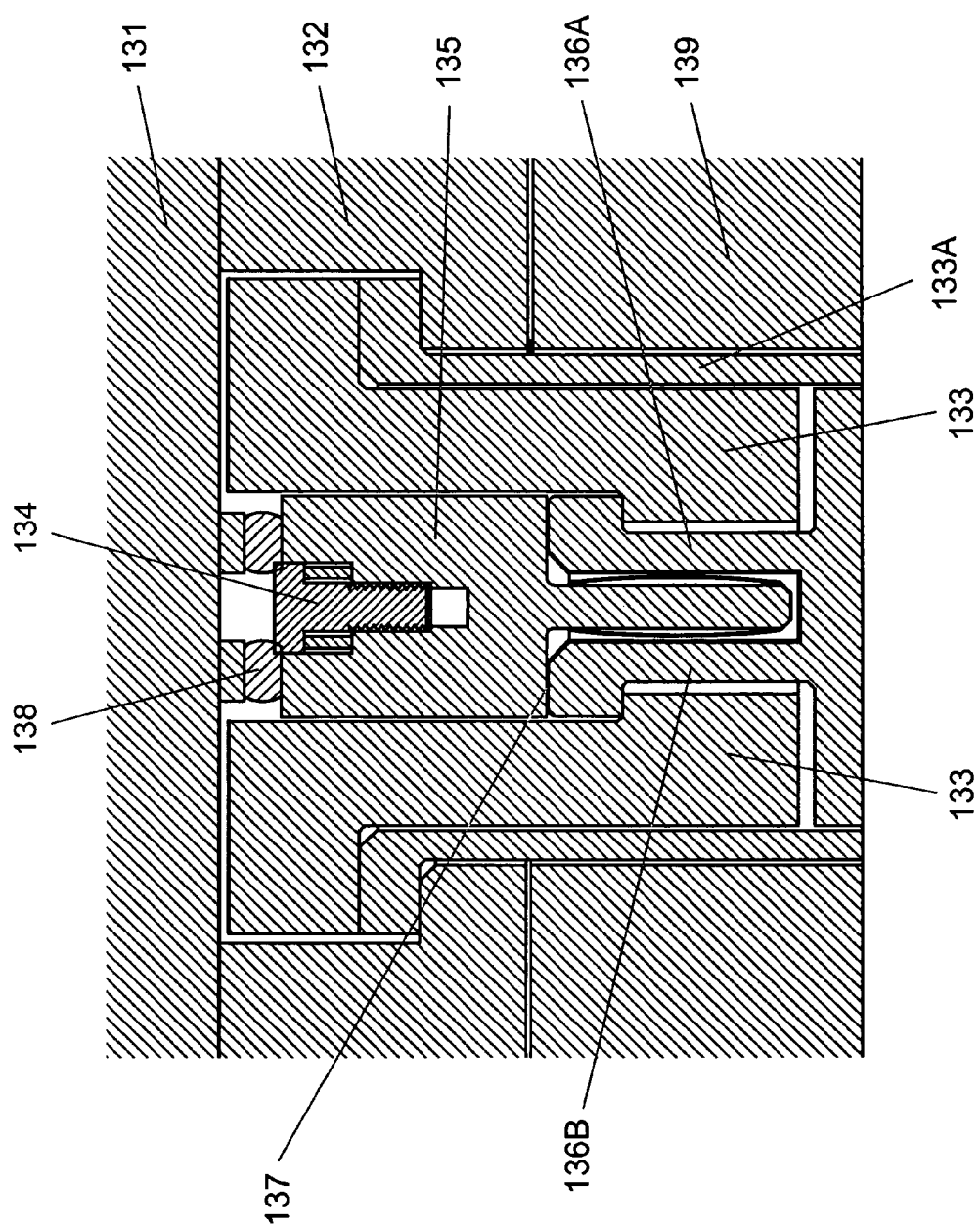
FIG. 13 shows an additional alternative embodiment of a PIF probe disposed in an upper electrode of a plasma processing chamber.

A schematic depiction of an additional exemplary alternative embodiment of a PIF probe embedded in the outer electrode part of a multi-piece showerhead electrode assembly is shown in FIG. 13. The design is similar to the design shown in FIG. 12 for use in the inner electrode, but certain modifications have been included. In this design, optional gas feed-through holes have been omitted. Additionally, details of optional means for advancement of planar disk 136A to compensate for any differential wear rate between the exposed silicon surface 227 and showerhead electrode surface have been omitted.

As in FIG. 12, planar disk 136A is adapted to reduce parasitic capacitance, and has a tubular extension 136B to receive and work cooperatively with conductor 135 to promote alignment and conductivity. Planar disk 136A with extension 136B and conductor 135 are surrounded by insulator 133, which serves to electrically isolate probe and conductor 135 from the surrounding electrode 139 and graphite backing plate 132. Insulator 133 is preferably a two part piece which fits around tubular extension 136B so as to support planar disk 136A and maintain its orientation towards the chamber interior. Electrical isolation of the probe from the electrode assembly is completed by external insulator 133A, which is in the shape of a cylindrical tube with an upper shoulder which fits with a recess in backing plate 132.

O-ring 138 is used to maintain position and electrical isolation of the conductor 135 from the remainder of the showerhead assembly. O-ring 138 is preferably made of a nonconductive, heat-resistant and mechanically resilient material such as Teflon. A thermal control plate 131 is in intimate contact with graphite backing plate 132. An RF feed rod 134 establishing electrical contact with the probe is shown perpendicular to the plane of the diagram embedded within conductor 135. In order to establish the electrical circuit necessary to operate the probe, RF feed rod 134 preferably traverses the chamber containment, from inside the chamber to outside the chamber, through a wall, window, vacuum feed-through or connector (not shown). Planar disk 136A maintains good electrical contact with the conductor 135 through the use of a leaf spring and conductive sputter coating applied to extension 136B at interface 137.

Figure 14:
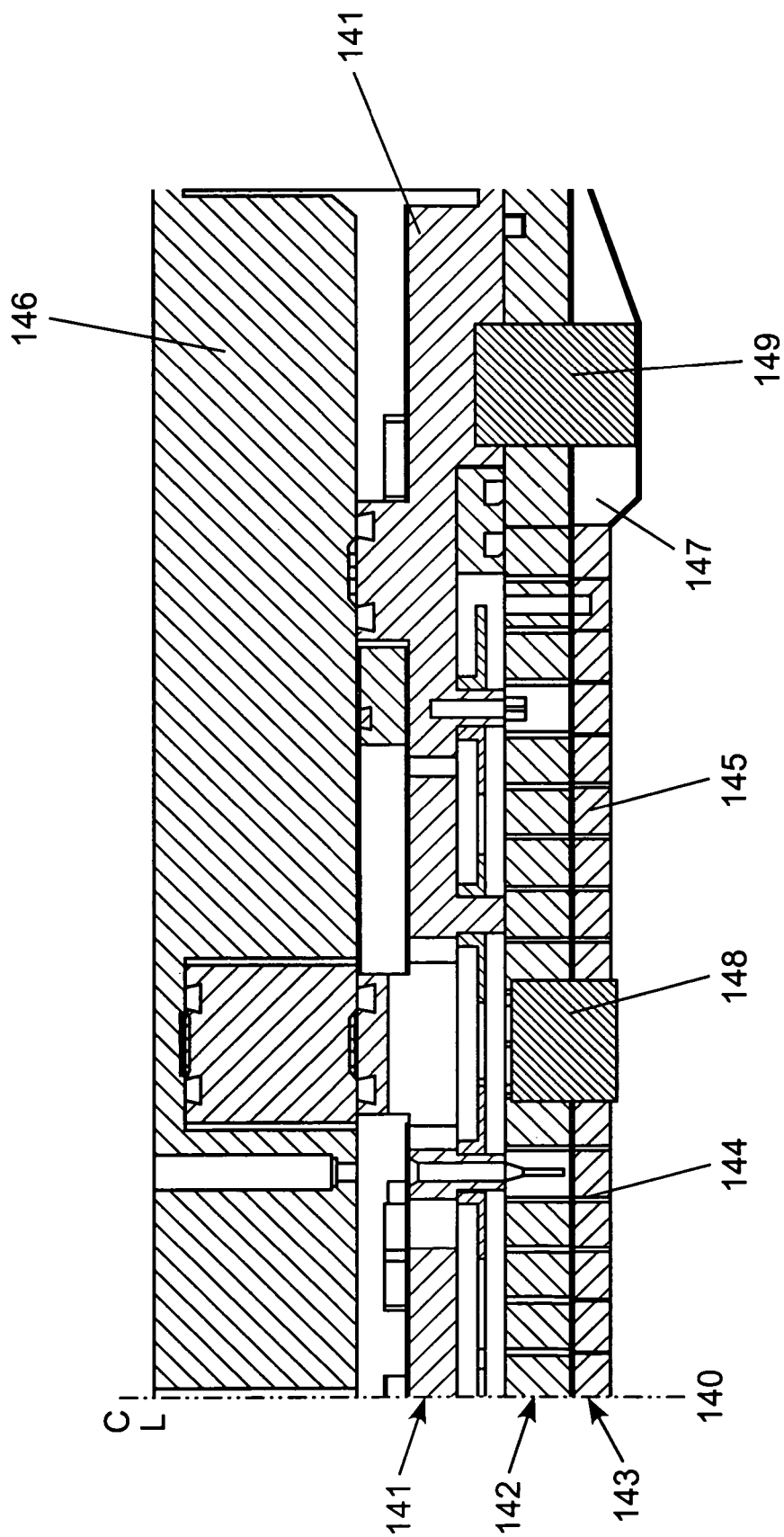
FIG. 14 shows an embodiment of PIF probes disposed in an inner and outer portion of an upper electrode of a plasma processing chamber.

A schematic depiction of one-half of a showerhead assembly 100 which can include one or more probes is shown in FIG. 14. The showerhead comprises a top electrode 143 and an optional backing member 142 secured to the top electrode 143, a thermal control plate 141, and a top plate 146. The top plate 146 can form a removable top wall of a plasma processing chamber. The top electrode 143 preferably includes an inner electrode member 145, and an optional outer electrode member 147. The inner electrode member 145 is preferably a cylindrical disk made of single crystal silicon. If desired, the inner and outer electrodes 145, 147 can be made of a single piece of material such as CVD silicon carbide, single crystal silicon or other suitable material.

The outer electrode member 147 can be a continuous member (e.g., a poly-silicon or silicon carbide member, such as a ring), or a segmented member (e.g., 2-6 separate segments arranged in a ring configuration, such as segments of single crystal silicon). In embodiments wherein the top electrode 143 includes a multiple-segment outer electrode member 147, the segments preferably have edges which overlap each other to protect an underlying bonding material from exposure to plasma. A plasma confinement ring assembly (not shown) preferably surrounds the outer electrode. The inner electrode member 145 preferably includes multiple gas passages 144 for injecting a process gas into a space in a plasma reaction chamber below the top electrode 143. The outer electrode 147 preferably forms a protruding step at the periphery of the electrode 143. Further details of a stepped electrode can be found in commonly-owned U.S. Pat. No. 6,824,627, the disclosure of which is hereby incorporated by reference.

FIG. 14 also shows an exemplary embodiment of probes of the type shown in FIG. 2 embedded in showerhead electrode assembly 140, which can incorporate one or more such probes. Since probes shown in FIGS. 11 and 12 comprise optional gas feed-through holes, the top electrode 143 preferably corresponds to 118 and 128 of FIGS. 11, and 12, respectively. Also, backing member 142 preferably corresponds to 119 and 129 of FIGS. 11, 12, respectively. For example, probe 148 is preferably configured with gas feed-through holes, as are the probes depicted in FIG. 11 and FIG. 12. Since the probe shown in FIG. 13 does not comprise gas feed-through holes, outer electrode 147 preferably corresponds to electrode 139 of FIG. 13. Also, thermal control plate 141 preferably corresponds to thermal control plate 131 of FIG. 13. For example, probe 149 is preferably configured without gas feed-through holes, like the probe shown in FIG. 13.

Figure 15:
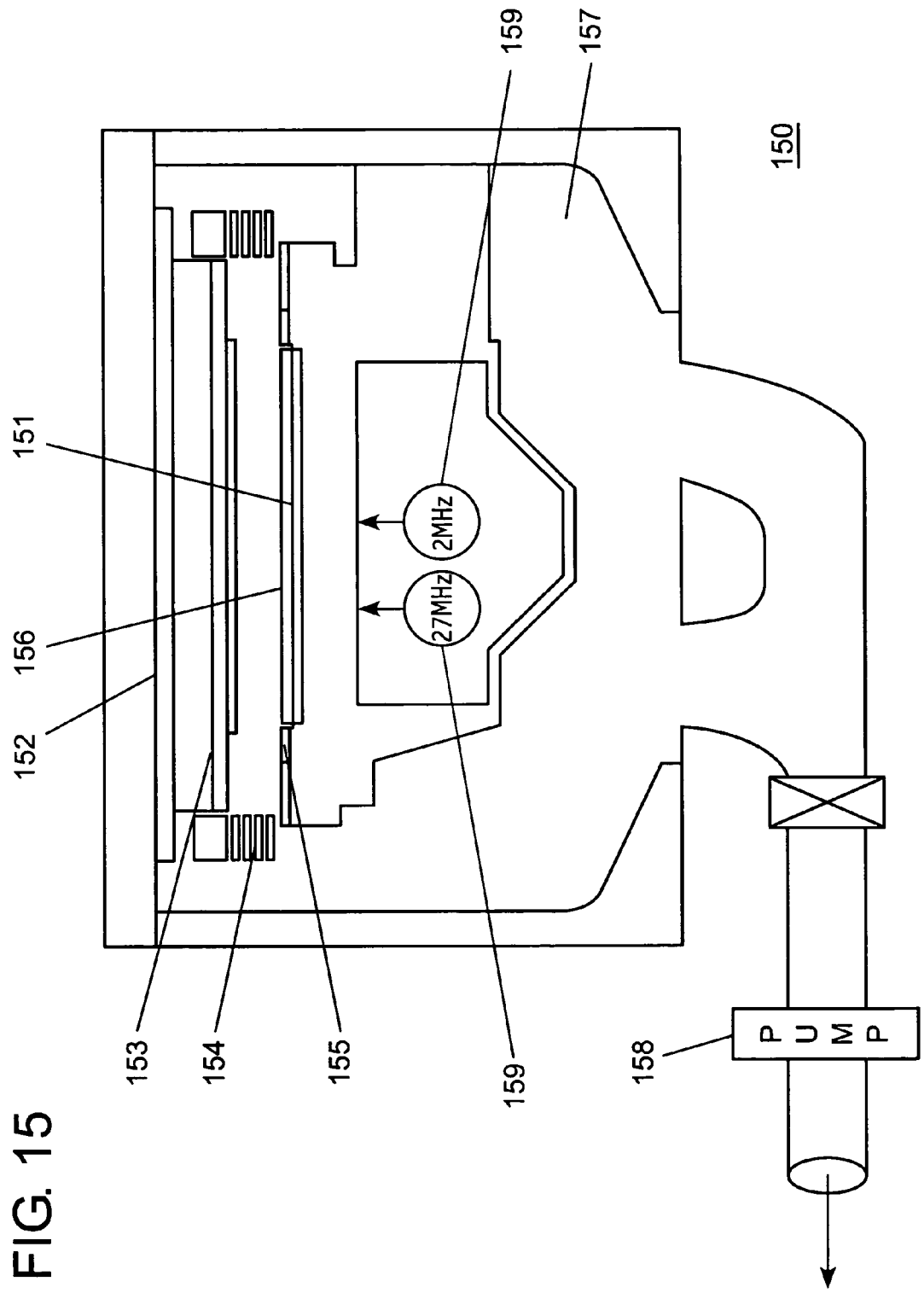
FIG. 15 shows an exemplary plasma process chamber.

An exemplary simplified schematic of a plasma process chamber in accordance with a preferred embodiment is shown in FIG. 15. The depicted system is a parallel plate plasma system 150 such as the EXELAN™ 2300 system available from Lam Research Corporation. The system 150 includes a chamber having an interior 157 maintained at a desired vacuum pressure by a vacuum pump 158 connected to an outlet in the bottom of the reactor. Etching gas is supplied to the plasma reactor from a gas feed (not shown). A medium density plasma is generated in the reactor by a dual frequency arrangement wherein RF energy from RF sources 159 is supplied through a matching network (not shown) to a powered lower electrode 151. The RF sources 159 are shown configured to supply RF power at 27 MHz and 2 MHz, however, numerous combinations of different frequency sources could be used. Plasma confinement is assisted by confinement rings 154. An upper electrode 153 is grounded and is connected to a heated top plate 152. A substrate, e.g. wafer (not shown), is clamped to electrostatic chuck (ESC) 156, which is surrounded by hot edge ring 155.

Additionally, other capacitively coupled reactors can be used, such as the EXELAN™ HPT series, or capacitively coupled reactors where RF power is supplied to both electrodes, such as the dual frequency plasma etch reactor described in commonly owned U.S. Pat. No. 6,090,304, the disclosure of which is hereby incorporated by reference. Although preferred embodiments have been discussed in conjunction with capacitively coupled plasma processing chambers, the embodiments also apply to inductively-coupled plasma processing chambers (such as Transformer Coupled Plasma or TCP™ plasma processing chambers from Lam Research Corporation), or electron cyclotron resonance (ECR) plasma processing chambers.

While the foregoing FIG. 14 shows planar probes incorporated in a showerhead electrode, a probe could be incorporated in other chamber parts provided the probe surface is exposed to the plasma environment within the chamber, such as a wall, a liner, a confinement ring, a focus ring, an electrode without gas outlets, a gas distribution plate and a substrate support. A planar probe may be disposed in the central part of an upper electrode in order to measure plasma parameters close to the substrate, or may be disposed in an outer part of the upper electrode so that it is not situated directly above a substrate.

In a further embodiment, a plurality of the probes are disposed such that the sensing surface of the probes are facing the interior of a plasma chamber. A plurality of probes could provide information related to the uniformity of the plasma, or could provide an internal relative calibration. For example, a probe could be positioned at or near the center of the showerhead electrode and additional probes could be positioned at different radii from the center position within the showerhead electrode.

While the invention has been described in detail with reference to specific embodiments thereof, it will be apparent to those skilled in the art that various changes and modifications can be made, and equivalents employed, without departing from the scope of the appended claims.

What is claimed is:

1. A method for monitoring a plasma process, comprising the steps of:
   initiating a plasma process within a plasma chamber;
   obtaining plasma parameter data on the plasma process wherein the plasma parameter data is obtained by use of a single planar ion flux (PIF) probe wherein a sensing surface of the PIF probe is exposed to the plasma and is coextensive with a wall or component surface within the plasma chamber; and
   evaluating the plasma parameter data for indications of a fault condition, wherein evaluation of the plasma parameter data includes any combination of:
   storing the plasma parameter data on a computer-readable storage medium system,
   filtering the plasma parameter data,
   subjecting the plasma parameter data to an algorithm,
   subjecting the plasma parameter data to a mathematical operation; and
   comparing the plasma parameter data to existing reference data, which results in an interpretation; and, the issuance of a status report and/or warning based on the interpretation.

2. The method of claim 1, wherein the plasma parameter data is obtained without substantively perturbing the plasma.

3. The method of claim 1, wherein the probe is positioned in a recess extending into a radio frequency biased surface or at a grounded surface.

4. The method of claim 1, wherein the plasma parameter data is obtained by applying a radio-frequency (RF) burst comprising at least one RF pulse to the PIF probe.

5. The method of claim 1, wherein the plasma parameter data is used to indicate that the plasma chamber fault condition is the occurrence of a poor stabilization rate.

6. The method of claim 1, wherein the plasma parameter data is used to indicate that the plasma chamber fault condition is the occurrence of a loss of plasma confinement.

7. The method of claim 1, wherein the plasma parameter data is used to indicate that the plasma chamber fault condition is the occurrence of lack of chamber matching in a group of plasma chambers running the same process recipe on the same type of wafers.

8. The method of claim 1, wherein (a) the status report and/or warning initiates a corrective step in the system, (b) the status report and/or warning records the interpretation in a log containing wafer history and/or (c) the status report and/or warning stops the processing of a wafer in the plasma chamber.

9. The method of claim 1, wherein (a) the plasma parameter data is collected as a series of measurements during the course of processing a wafer, and/or (b) the plasma parameter data comprises post-RF ramp plasma density data.

10. The method of claim 9, wherein the series of measurements of a plasma parameter as a function of time are plotted in graph form.

11. The method of claim 9, wherein the fault condition is a build-up of process by-products in the process chamber.

12. The method of claim 9, wherein a change in the slope of the post-RF ramp plasma density data is used to indicate the plasma chamber fault condition is a build-up of process by-products in the process chamber.

13. The method of claim 9, wherein stability in the amplitude of the plasma density after match tuning takes more than about one half second before returning to its proper equilibrium point, indicating that the plasma chamber fault condition is the occurrence of a poor stabilization rate.

14. The method of claim 9, wherein an oscillation of the plasma density after an RF ramp of between about 5% and about 20% of the absolute value of the plasma density is used to indicate that the plasma chamber fault condition is a helium leak.

15. The method of claim 9, wherein an oscillation of the plasma density less than 5% of the absolute value of the plasma density and of duration less than 5 seconds, occurring after the RF ramp, is used to indicate that the plasma chamber fault condition is a random re-tuning of the matching system.

* * * * *